US008614488B2

(12) United States Patent
Wen et al.

(10) Patent No.: US 8,614,488 B2
(45) Date of Patent: Dec. 24, 2013

(54) CHIP PACKAGE AND METHOD FOR FORMING THE SAME

(76) Inventors: Ying-Nan Wen, Hsinchu (TW); Ho-Yin Yiu, Kln (HK); Yen-Shih Ho, Kaohsiung (TW); Shu-Ming Chang, New Taipei (TW); Chien-Hung Liu, New Taipei (TW); Shih-Yi Lee, Zhongli (TW); Wei-Chung Yang, Pingzhen (TW)

( * ) Notice: Subject to any disclaimer, the term of this patent is extended or adjusted under 35 U.S.C. 154(b) by 67 days.

(21) Appl. No.: 13/314,114

(22) Filed: Dec. 7, 2011

(65) Prior Publication Data
US 2012/0146153 A1   Jun. 14, 2012

Related U.S. Application Data

(60) Provisional application No. 61/421,170, filed on Dec. 8, 2010.

(51) Int. Cl.
*H01L 21/70* (2006.01)

(52) U.S. Cl.
USPC .......................................................... 257/368

(58) Field of Classification Search
CPC . H01L 29/78; H01L 29/66477; G02F 1/1368; G06F 17/5068
USPC ........... 257/368, E27.062, E21.586, E21.158, 257/41, 81, 82, 91, 99, 177–182, 276, 457, 257/459, 502, 503, 573, 584, 602, 621, 257/664–677, 688–700, 734–786, 257/E23.01–E23.079, E23.141–E23.179; 438/613–617, 677, 597
See application file for complete search history.

(56) References Cited

U.S. PATENT DOCUMENTS

| 7,459,381 | B2 * | 12/2008 | Sutardja | 438/499 |
| 8,329,508 | B2 * | 12/2012 | Yilmaz et al. | 438/107 |
| 8,338,958 | B2 * | 12/2012 | Nishio et al. | 257/774 |
| 2006/0145245 | A1 * | 7/2006 | Hara et al. | 257/327 |
| 2008/0277733 | A1 * | 11/2008 | Fukutome | 257/368 |
| 2010/0289092 | A1 * | 11/2010 | Perng et al. | 257/401 |
| 2011/0084365 | A1 * | 4/2011 | Law et al. | 257/621 |
| 2011/0193167 | A1 * | 8/2011 | Fung et al. | 257/350 |

* cited by examiner

*Primary Examiner* — Dao H Nguyen
*Assistant Examiner* — Tram H Nguyen
(74) *Attorney, Agent, or Firm* — Liu & Liu (57) ABSTRACT

A chip package includes: a substrate; a drain and a source regions located in the substrate; a gate located on or buried in the substrate; a drain conducting structure, a source conducting structure, and a gate conducting structure, disposed on the substrate and electrically connected to the drain region, the source region, and the gate, respectively; a second substrate disposed beside the substrate; a second drain and a second source region located in the second substrate, wherein the second drain region is electrically connected to the source region; a second gate located on or buried in the second substrate; and a second source and a second gate conducting structure disposed on the second substrate and electrically connected to the second source region and the second gate, respectively, wherein terminal points of the drain, the source, the gate, the second source, and the second gate conducting structures are substantially coplanar.

20 Claims, 13 Drawing Sheets

CHIP PACKAGE AND METHOD FOR FORMING THE SAME

CROSS REFERENCE TO RELATED APPLICATIONS

This Application claims the benefit of U.S. Provisional Application No. 61/421,170, filed on Dec. 8, 2010, the entirety of which is incorporated by reference herein.

BACKGROUND OF THE INVENTION

1. Field of the Invention

The invention relates to a chip package, and in particular relates to a MOSFET chip package.

2. Description of the Related Art

The chip packaging process is an important process when fabricating an electronic product. Chip packages not only provide chips with protection from environmental contaminants, but also provide an interface for connection between electronic elements in the chips and electronic elements outside of the chip package.

Reducing the size of a chip package and further improving performance of the chip package have become important issues.

BRIEF SUMMARY OF THE INVENTION

An embodiment of the invention provides a chip package which includes: a semiconductor substrate; a drain region and a source region located in the semiconductor substrate; a gate located on the semiconductor substrate or at least partially buried in the semiconductor substrate; a drain conducting structure, a source conducting structure, and a gate conducting structure, disposed on the semiconductor substrate and electrically connected to the drain region, the source region, and the gate, respectively; a second semiconductor substrate laterally disposed beside the semiconductor substrate; a second drain region and a second source region located in the second semiconductor substrate, wherein the second drain region is electrically connected to the source region in the semiconductor substrate; a second gate located on the second semiconductor substrate or at least partially buried in the second semiconductor substrate; and a second source conducting structure and a second gate conducting structure disposed on the second semiconductor substrate and electrically connected to the second source region and the second gate, respectively, wherein terminal points of the drain conducting structure, the source conducting structure, the gate conducting structure, the second source conducting structure, and the second gate conducting structure are substantially coplanar.

An embodiment of the invention provides a method for forming a chip package which includes: providing a semiconductor substrate having a MOSFET and an adjacent second MOSFET, wherein the MOSFET comprises a drain region, a source region, and a gate, and the second MOSFET comprises a second drain region, a second source region, and a second gate; disposing, on a surface of the semiconductor substrate, a drain conducting structure, a source conducting structure, and a gate conducting structure to electrically connect to the drain region, the source region, and the gate, respectively, wherein terminal points of the drain conducting structure, the source conducting structure, the gate conducting structure, the second source conducting structure, and the second gate conducting structure are substantially coplanar; and electrically connecting the source region to the second drain region.

An embodiment of the invention provides a method for forming a chip package which includes: providing a semiconductor substrate having a drain region, a source region, and a gate; providing a second semiconductor substrate having a second drain region, a second source region, and a second gate; laterally disposing the second semiconductor substrate beside the semiconductor substrate; disposing, on a surface of the semiconductor substrate, a drain conducting structure, a source conducting structure, and a gate conducting structure to electrically connect to the drain region, the source region, and the gate, respectively; disposing, on a surface of the second semiconductor substrate, a second source conducting structure and a second gate conducting structure to electrically connect to the second source region and the second gate, respectively, wherein terminal points of the drain conducting structure, the source conducting structure, the gate conducting structure, the second source conducting structure, and the second gate conducting structure are substantially coplanar; and electrically connecting the source region to the second drain region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a MOSFET chip such as a power module chip. However, embodiments of the invention are not limited thereto. For example, the chip package of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power ICs.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

Figure 1A:
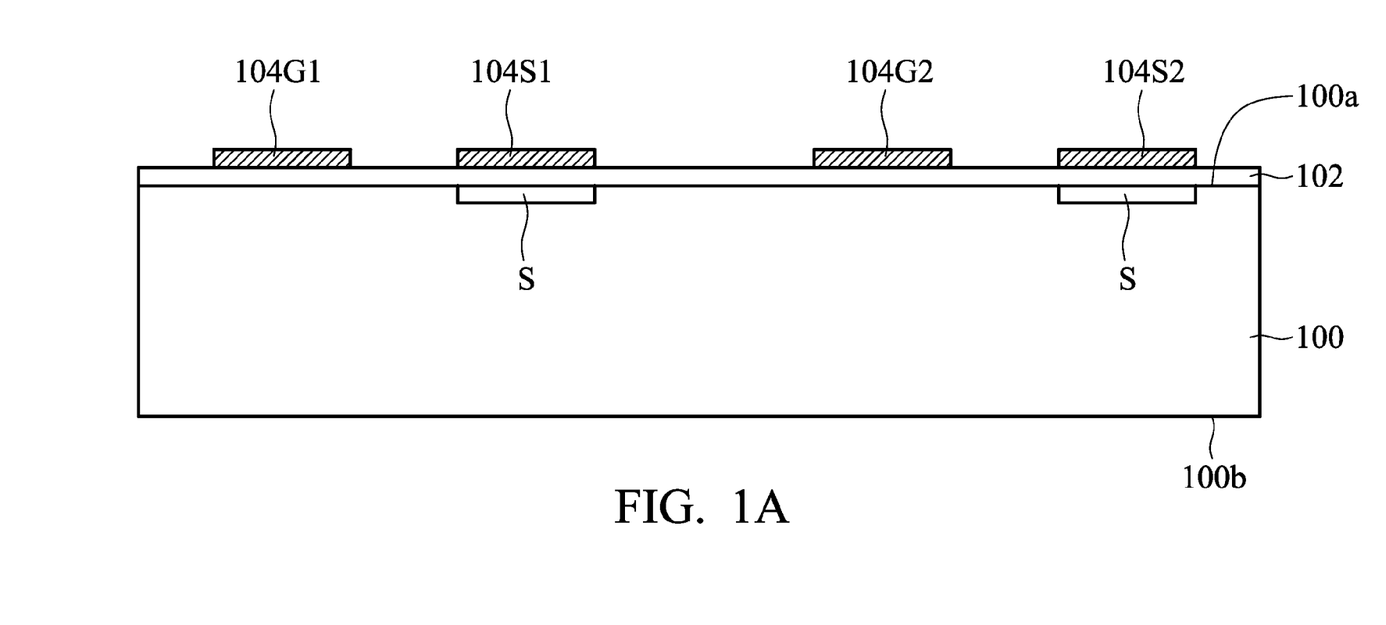
FIGS. 1A-1H are cross-sectional views showing the steps of forming a chip package according to an embodiment of the present invention.

FIGS. 1A-1H are cross-sectional views showing the steps of forming a chip package according to an embodiment of the present invention. As shown in FIG. 1A, a semiconductor substrate 100 is provided, which has a surface 100a and a surface 100b and has a plurality of MOSFETs formed therein. The semiconductor substrate 100 may be, for example, a silicon substrate such as a silicon wafer. In another embodiment, the semiconductor substrate 100 may also be other suitable semiconductor materials such as germanium, silicon germanium, silicon carbide, gallium arsenide, or the like.

A plurality of source regions and drain regions may be preformed in the semiconductor substrate 100. In one embodiment, a conductivity type of the semiconductor substrate 100 may be an N-type or P-type. Typically, the conductivity type of the semiconductor substrate 100 is commonly N-type. Take the N-type semiconductor substrate 100 as an example, the semiconductor substrate 100 may be a silicon substrate doped with N-type dopants. The type and doping concentration of the dopant in the semiconductor substrate 100 may not be uniform. For example, the type and doping concentration of an n-type dopant doped in a lower portion of the semiconductor substrate 100 (the portion near the surface 100b) may be different from those of an n-type dopant doped in an upper portion of the semiconductor substrate 100 (the portion near the surface 100a). The semiconductor substrate 100, by itself, may form a drain region. Thus, the reference number 100 may also represent the drain region (i.e., the portion of the semiconductor substrate not being formed with the source region or another doped region).

In one embodiment, the semiconductor substrate 100 may include a plurality of doped regions (not shown) which may extend from the surface 100a or a position near the surface 100a towards the surface 100b. The conductivity type of the doped region is different from that of the semiconductor substrate 100. For example, if the semiconductor substrate 100 is an n-type substrate, the conductivity type of the doped region is p-type, and vice versa.

In one embodiment, the semiconductor substrate 100 includes source regions S which may be located in the doped regions. The conductivity types of the source regions S and the semiconductor substrate 100 are the same, such as n-type. In one embodiment, the source region S extends from the surface 100a or a position near the surface 100a towards the surface 100b, and may be partially surrounded by the doped region. In FIG. 1A, for simplicity and clarity, only the source regions S are illustrated.

In one embodiment, a dielectric layer 102 is disposed on the surface 100a of the semiconductor substrate 100. At least a source electrode 104S1 and at least a source electrode 104S2 may be formed on or in the dielectric layer 102, which may be electrically and respectively connected to the corresponding source regions S through a conducting path formed in the dielectric layer 102 and/or the semiconductor substrate 100. For example, in one embodiment, the source electrode 104S1 and the source electrode 104S2 are electrically and respectively connected to the source regions S through via structures formed in the dielectric layer 102 thereunder.

In one embodiment, at least a gate 104G1 and at least a gate 104G2 may also be formed on or in the dielectric layer 102, which may be, for example, (but is not limited to) a polysilicon layer. The dielectric layer 102 between the gate 104G1 and/or the gate 104G2 and the semiconductor substrate 100 may be used as a gate dielectric layer. In addition, in another embodiment, the gate and the gate dielectric layer may be a buried structure, which may be formed in a recess of the substrate. In this case, the gate 104G1 and/or the gate 104G2 is at least partially buried in the semiconductor substrate 100. The source regions, the drain regions, and the gates formed in the semiconductor substrate 100 together form a plurality of MOSFETs.

In the embodiment shown in FIG. 1, conducting contacts (such as solder balls or conducting bumps) electrically contacting with other electronic components (such as a printed circuit board) will be formed on the surface 100b of the semiconductor substrate 100. Thus, conducting routes extending from the surface 100a towards the surface 100b need to be formed in the semiconductor substrate such that the conducting contacts subsequently disposed on the surface 100b can be electrically connected to the elements (such as the gates 104G1, 104G2 or the source electrodes 104S1, 104S2) disposed on the surface 100a.

Figure 1B:
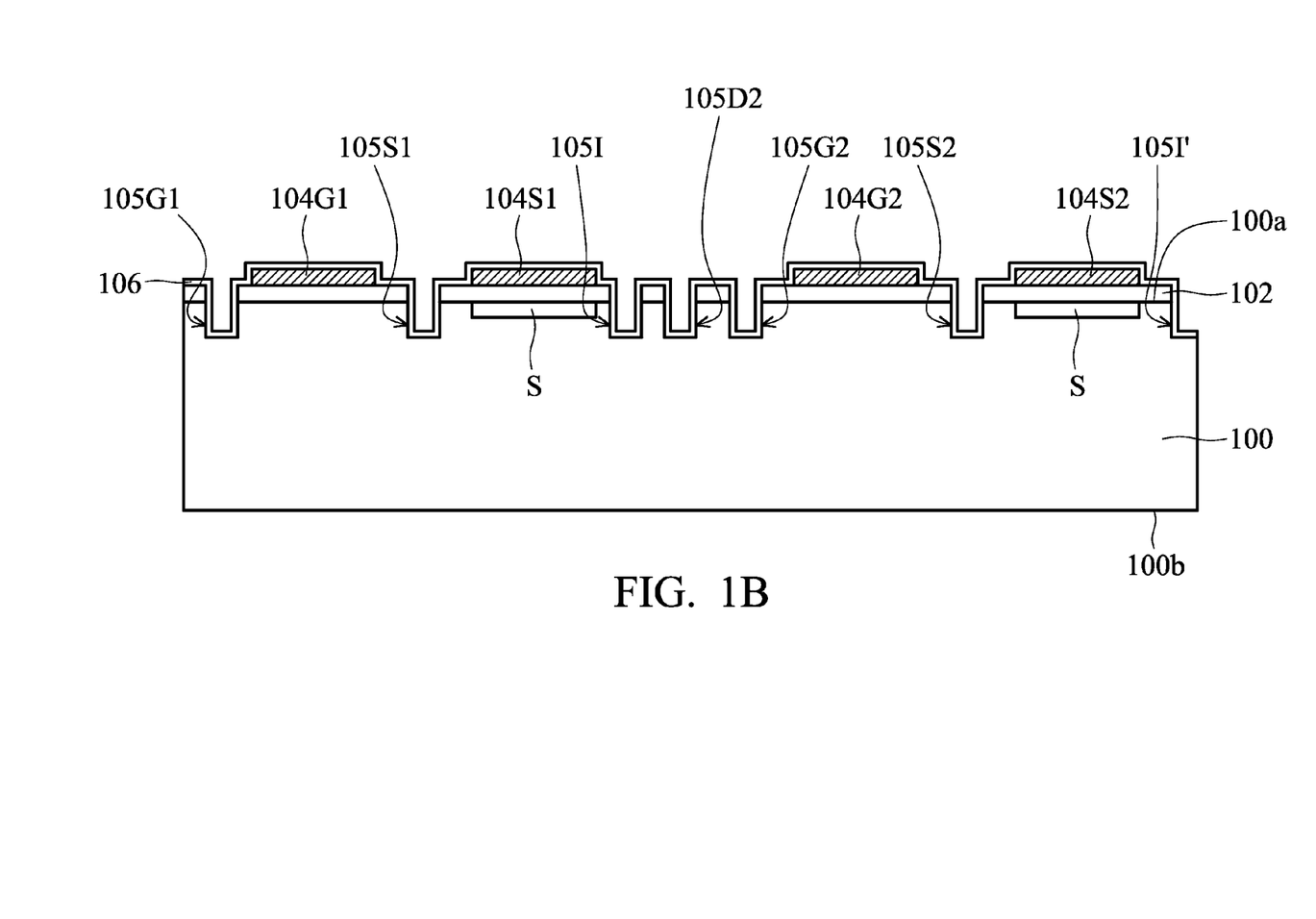

In one embodiment, the conducting routes connecting the elements on the surfaces 100a and 100b are established by through substrate conducting structures. During the formation of the through substrate conducting structures, holes need to be previously formed in the semiconductor substrate 100. As shown in FIG. 1B, a portion of the semiconductor substrate 100 may be removed from the surface 100a to form a plurality of holes extending towards the surface 100b by, for example, etching or physical drilling. In one embodiment, through substrate conducting structures electrically connected to the gate 104G1, the source electrode 104S1, the drain region, and the source electrode 104S2 will be formed in the holes 105G1, 105S1, 105D2, and 105S2, respectively. In addition, the hole 105I formed between the source region S on the left side and the hole 105D2 is filled with an insulating material in a subsequent process to form an insulating structure between two adjacent MOSFETs. Similarly, the hole 105I' may be filled with an insulating material in a subsequent process to form an insulating structure between two adjacent MOSFETs.

As shown in FIG. 1B, after the holes are formed, an insulating layer 106 may be conformally formed on the surface 100a of the semiconductor substrate 100 and sidewalls and bottoms of the holes. The insulating layer 106 may include a polymer material such as epoxy resin, polyimide, or combinations thereof. The material of the insulating layer 106 may also include (but is not limited to) an oxide, nitride, oxynitride, metal oxide, or combinations thereof. The formation method of the insulating layer 106 includes, for example, a spray coating process, printing process, dipping process, chemical vapor deposition process, or combinations thereof.

Figure 1C:
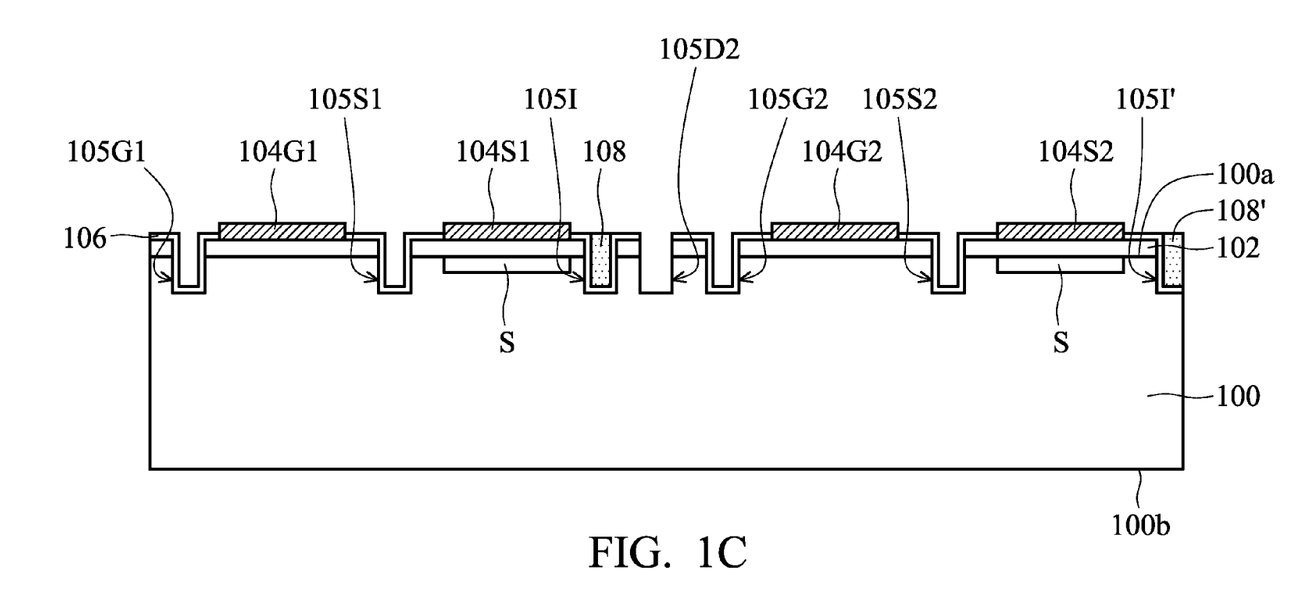

Next, as shown in FIG. 1C, a portion of the insulating layer 106 is removed such that the gates 104G1, 104G2 and the source electrodes 104S1, 104S2 are at least partially exposed. Then, an insulating material may be filled into the holes 105I, 105I' to form insulating structures 108, 108', respectively. In another embodiment, the insulating structure 108 may be first formed, followed by patterning of the insulating layer 106 to expose the gates 104G1, 104G2 and the source electrodes 104S1, 104S2. The insulating structure 108 separates two adjacent MOSFETs such that operations thereof do not interfere with each other. In addition, in one embodiment, the insulating layer 106 in the hole 105D2 needs to be at least partially removed such that the drain region of the MOSFET on the right side of the insulating structure 108 (i.e., the semiconductor substrate on the right side) is at least partially exposed. In one embodiment, the insulating layer 106 in the hole 105D2 is completely removed.

Figure 1D:
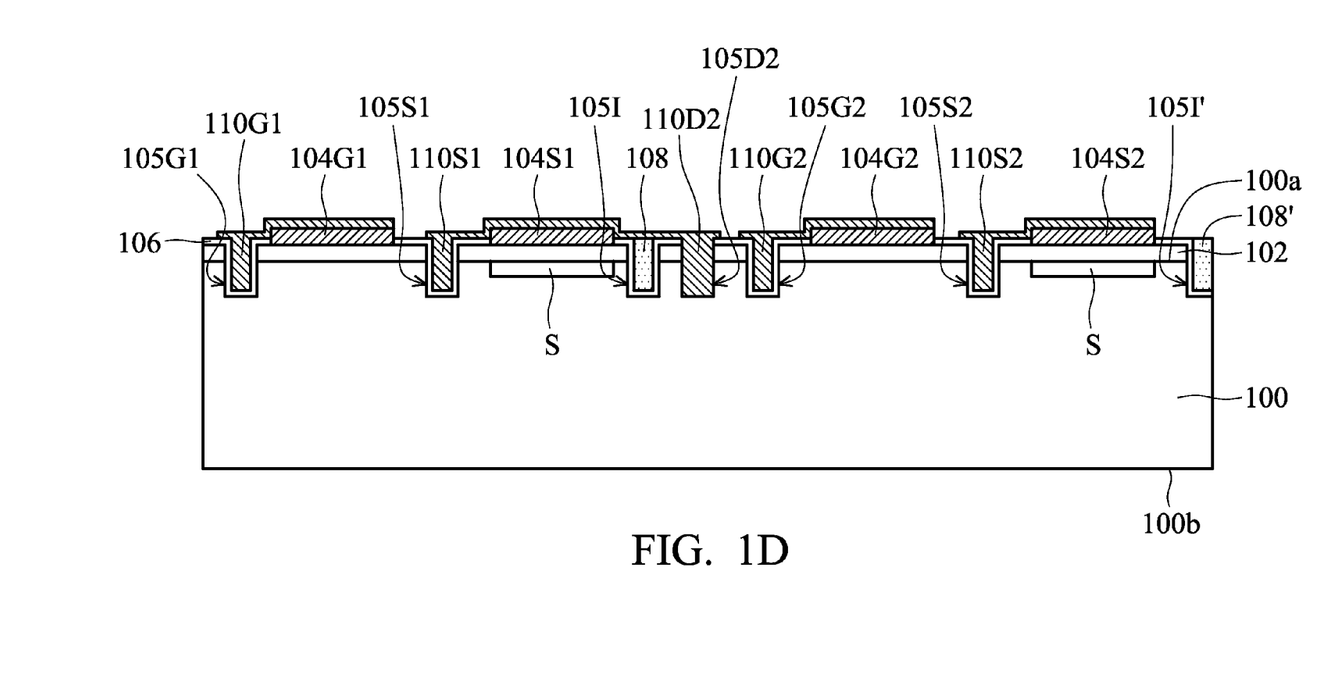

Next, as shown in FIG. 1D, a patterned conducting layer is formed on the surface 100a of the semiconductor substrate 100, which fills into the previously defined holes to serve as through substrate conducting structures. In the embodiment shown in FIG. 1D, although the patterned conducting layer substantially fills the corresponding holes completely, embodiments of the invention are not limited thereto. In another embodiment, the patterned conducting layer may be, for example, conformally formed on the bottoms and the sidewalls of the corresponding holes. The material of the patterned conducting layer includes, for example, (but is not limited to) copper, aluminum, gold, platinum, silver, or combinations thereof. The formation method of the patterned conducting layer includes, for example, a physical vapor deposition process, chemical vapor deposition process, coating, electroplating, electroless plating, or combinations thereof.

As shown in FIG. 1D, a conducting layer 110G1 is formed in the hole 105G1 and electrically connected to the gate 104G1. For example, the conducting layer 110G1 may extend on the gate 104G1 to electrically contact with the gate 104G1. A conducting layer 110G2 is formed in the hole 105G2 and electrically connected to the gate 104G2. For example, the conducting layer 110G2 may extend on the gate 104G2 to electrically contact with the gate 104G2. A conducting layer 110S2 is formed in the hole 105S2 and electrically connected to the source electrode 104S2. For example, the conducting layer 110S2 may extend on the source electrode 104S2 to electrically contact with the source electrode 104S2. The conducting layer extending on the semiconductor substrate may also be called a redistribution layer.

A conducting layer 110S1 is formed in the hole 105S1 and electrically connected to the source electrode 104S1. A conducting layer 110D2 is formed in the hole 105D2 and electrically connected to the drain region of the MOSFET on the right side of the insulating layer 108. The conducting layer 110S1 may extend on the source electrode 104S1 to electrically contact with the source electrode 104S1. Similarly, the conducting layer 110D2 may extend on the source electrode 104S1 to electrically contact with the source electrode 104S1. Thus, the conducting layer 110S1 and the conducting layer 110D2 are electrically connected to each other through the source electrode 104S1. In other words, the source region S of the MOSFET on the left side of the insulating structure 108 is electrically connected to the drain region of the MOSFET on the right side of the insulating structure 108.

Figure 1E:
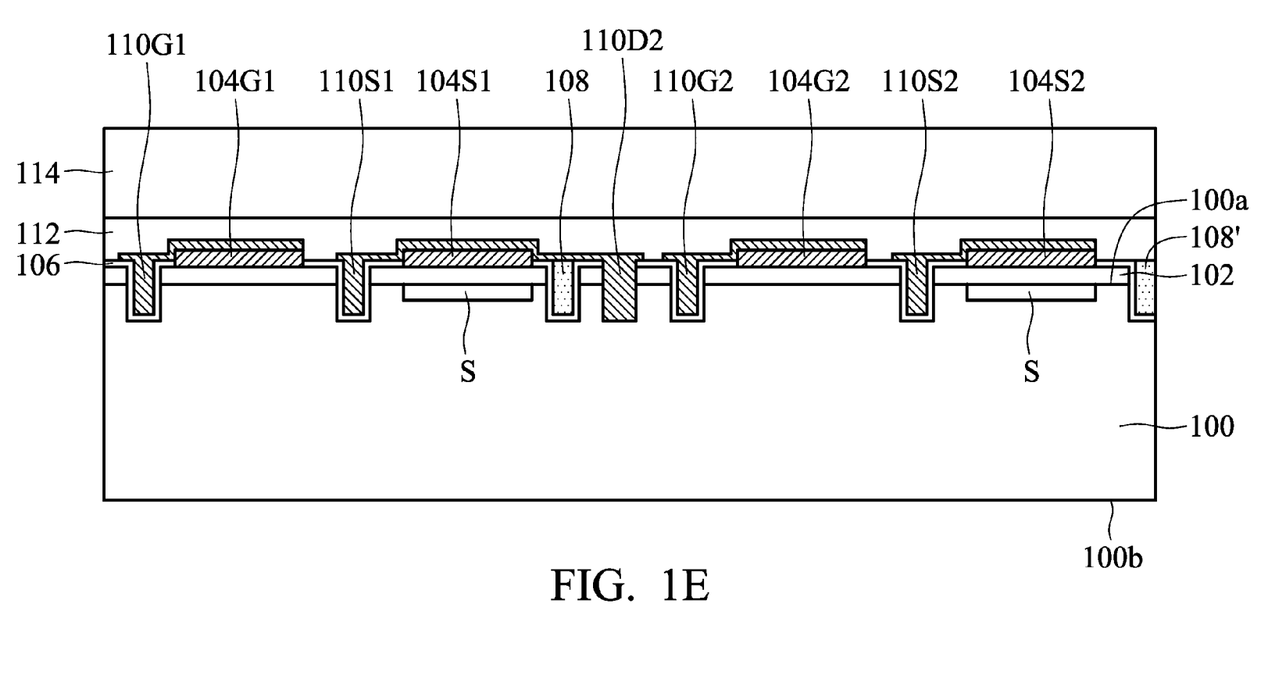

Next, as shown in FIG. 1E, a carrier substrate 114 may be optionally disposed on the surface 100a of the semiconductor substrate 100 through an adhesion layer 112 to facilitate subsequent processes.

Figure 1F:
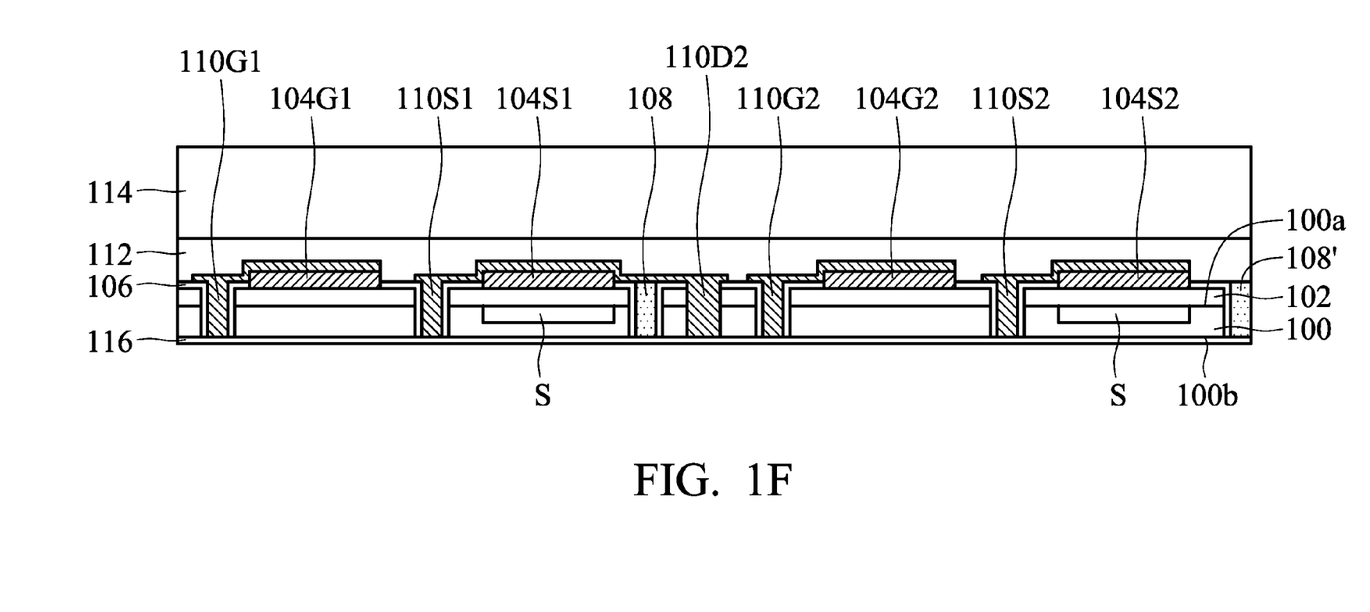

Next, as shown in FIG. 1F, the carrier substrate 114 may be used as a support, and the semiconductor substrate 100 is thinned from the surface 100b of the semiconductor substrate 100 by using, for example, a mechanical grinding and/or chemical mechanical polishing process. In one embodiment, the semiconductor substrate 100 is thinned until the pre-formed through substrate conducting structures are exposed. After the thinning process is performed, an insulating layer 116 may be formed on the surface 100b of the semiconductor substrate 100. The material and the formation method of the insulating layer 116 may be similar to those of the insulating layer 106.

Figure 1G:
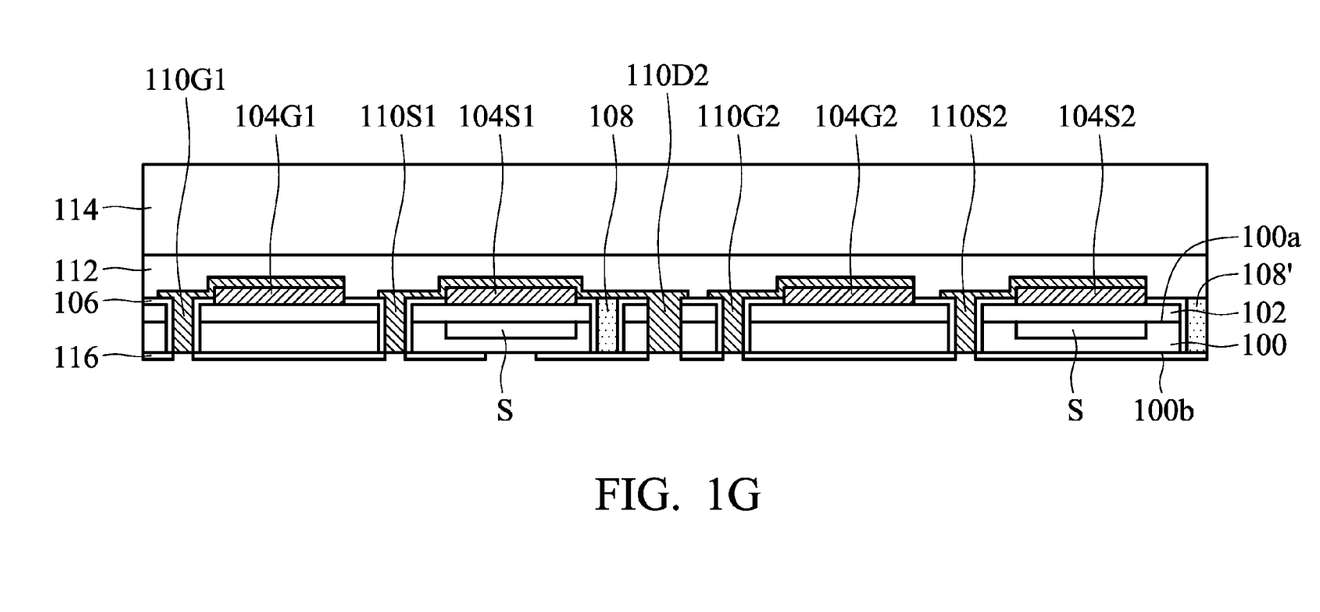

Next, as shown in FIG. 1G, through a patterning process, the insulating layer 116 is patterned to form openings exposing the through substrate conducting structures and the drain region of the MOSFET on the left side of the insulating structure 108.

Figure 1H:
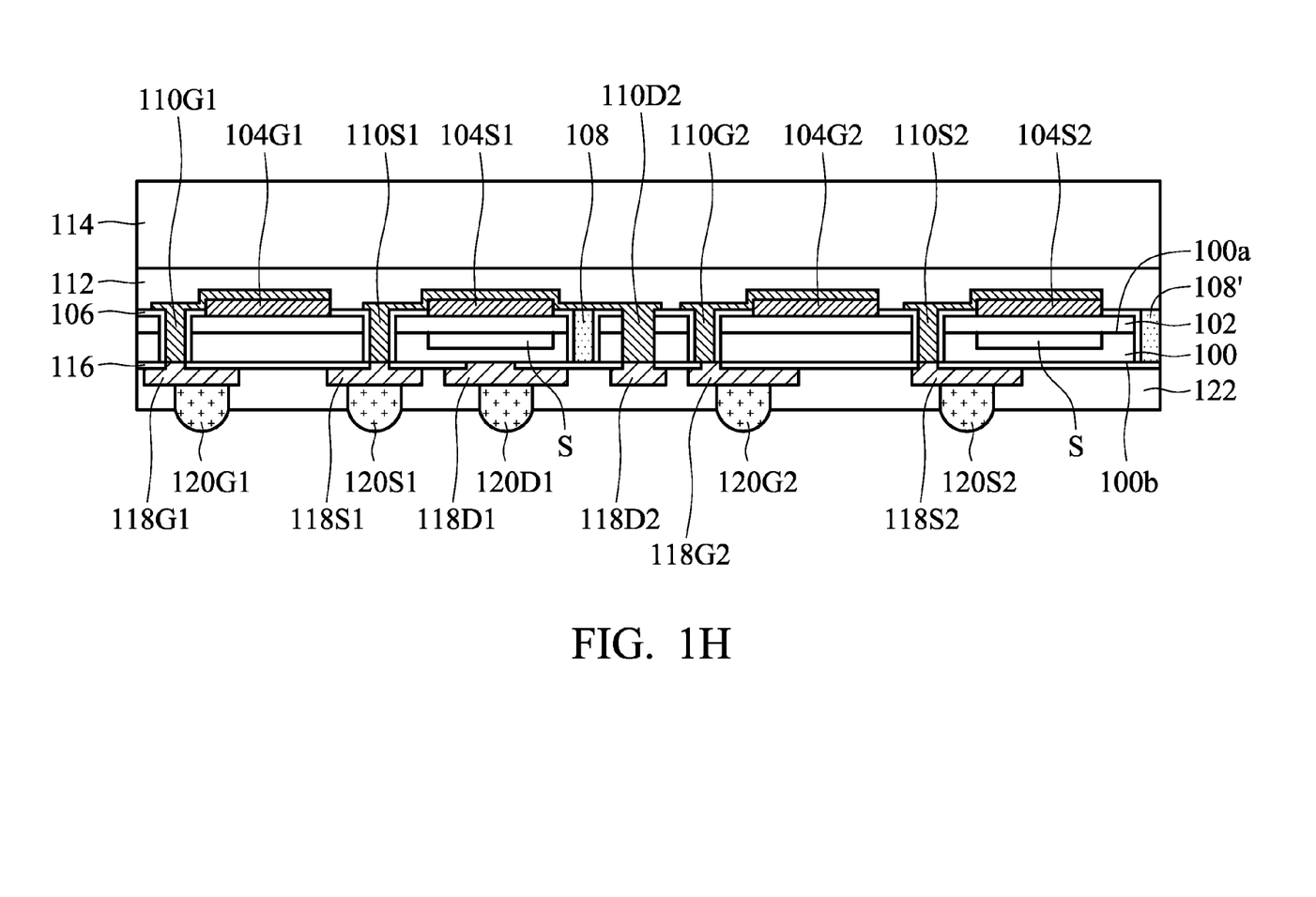

Next, as shown in FIG. 1H, patterned conducting layers 118G1, 118S1, 118D1, 118D2, 118G2, and 118S2 are formed on the insulating layer 116. Through the openings of the insulating layer 116, the patterned conducting layers may be electrically connected to the corresponding through substrate conducting structures or the drain region, respectively. The patterned conducting layers may serve as pads for solder balls or metal bumps. In one embodiment, the conducting layer 118D2 may not be formed. The material of the patterned conducting layer includes, for example, (but is not limited to) copper, aluminum, gold, platinum, silver, vanadium, titanium, or combinations thereof. The formation method of the patterned conducting layer includes, for example, a physical vapor deposition process, chemical vapor deposition process, coating, electroplating, electroless plating, or combinations thereof.

As shown in FIG. 1H, a protection layer 122 may be formed on the surface 100b of the semiconductor substrate 100. A plurality of openings may be defined in the protection layer 122, which expose the conducting layers 118G1, 118S1, 118D1, 118G2, and 118S2, respectively. Then, conducting bumps 120G1, 120S1, 120D1, 120G2, and 120S2 may be formed on the exposed conducting layers 118G1, 118S1, 118D1, 118G2, and 118S2, respectively. Terminal points of the conducting bumps 120G1, 120S1, 120D1, 120G2, and 120S2 are substantially coplanar, thus facilitating integration with another electronic element (such as a printed circuit board). The plane where the terminal points of the conducting bumps 120G1, 120S1, 120D1, 120G2, and 120S2 are located may be substantially parallel to the surface 100a or 100b of the semiconductor substrate. The semiconductor substrate 100 may be diced along predetermined scribe lines (not shown) of the semiconductor substrate 100 to form a plurality of individual chip packages. In addition, in one embodiment, the adhesion layer 112 and the carrier substrate 114 may be optionally removed.

In the embodiment shown in FIG. 1H, the insulating structure 108 separates the semiconductor substrate 100 into two laterally disposed semiconductor substrates. Further, the conducting layers 110G1, 118G1, and the conducting bump 120G1 serve as a gate conducting structure electrically connecting to the gate 104G1. The source electrode 104S1, the conducting layers 110S1, 118S1, and the conducting bump 120S1 serve as a source conducting structure electrically connecting to the source region S on the left side. The conducting layer 118D1 and the conducting bump 120D1 serve as a drain conducting structure electrically connecting to the drain region on the left side. The conducting layers 110G2, 118G2, and the conducting bump 120G2 serve as a gate conducting structure electrically connecting to the gate 104G2. The source electrode 104S2, the conducting layers 110S2, 118S2, and the conducting bump 120S2 serve as a source conducting structure electrically connecting to the source region S on the right side. In addition, the drain region on the right side may be electrically connected to the source region on the left side. Thus, the two adjacent MOSFETs may operate together.

Embodiments of the invention may have many variations. For example, FIGS. 2A-2E are cross-sectional views showing the steps of forming a chip package according to an embodiment of the present invention, wherein same or similar reference numbers are used to designate same or similar elements. In addition, the material and the formation method of same or similar elements may be substantially the same with or similar to those of the embodiment shown in FIG. 1.

Figure 2A:
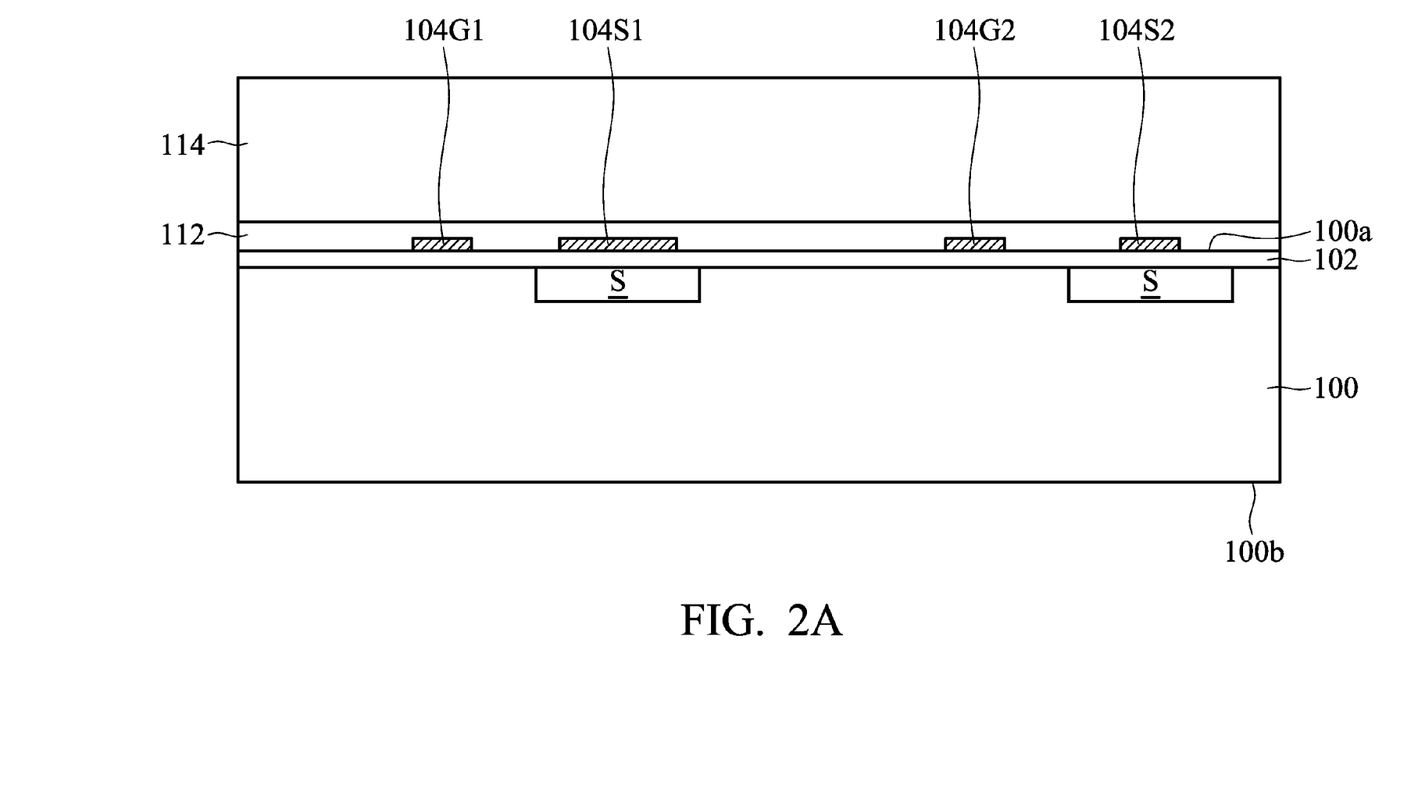
FIGS. 2A-2E are cross-sectional views showing the steps of forming a chip packages according to embodiments of the present invention.

As shown in FIG. 2A, a semiconductor substrate 100 similar to that shown in FIG. 1A is provided. A surface 100a of the semiconductor substrate 100 may be formed with a dielectric layer 102, gates 104G1, 104G2, and source electrodes 104S1, 104S2, wherein the source electrodes are electrically connected to source regions S preformed in the semiconductor substrate 100, respectively. Then, a carrier substrate 114 may be disposed on the surface 100a of the semiconductor substrate 100 through an adhesion layer 112.

Figure 2B:
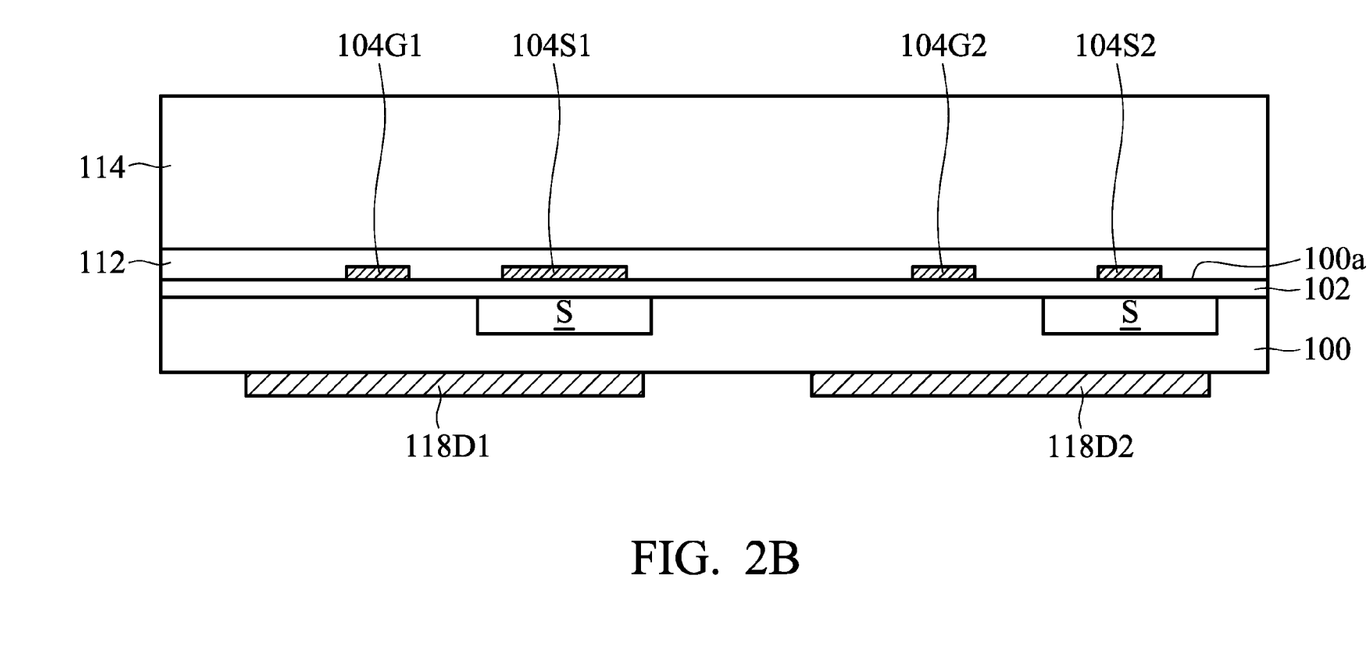

Next, as shown in FIG. 2B, the carrier substrate 114 is used as a support, and the semiconductor substrate 100 is thinned from the surface 100b of the semiconductor substrate 100 to a suitable thickness. Then, patterned conducting layers 118D1 and 118D2 are formed on the surface 100b of the semiconductor substrate 100. The patterned conducting layers 118D1 and 118D2 are electrically connected to the drain regions in the semiconductor substrate, respectively.

Figure 2C:
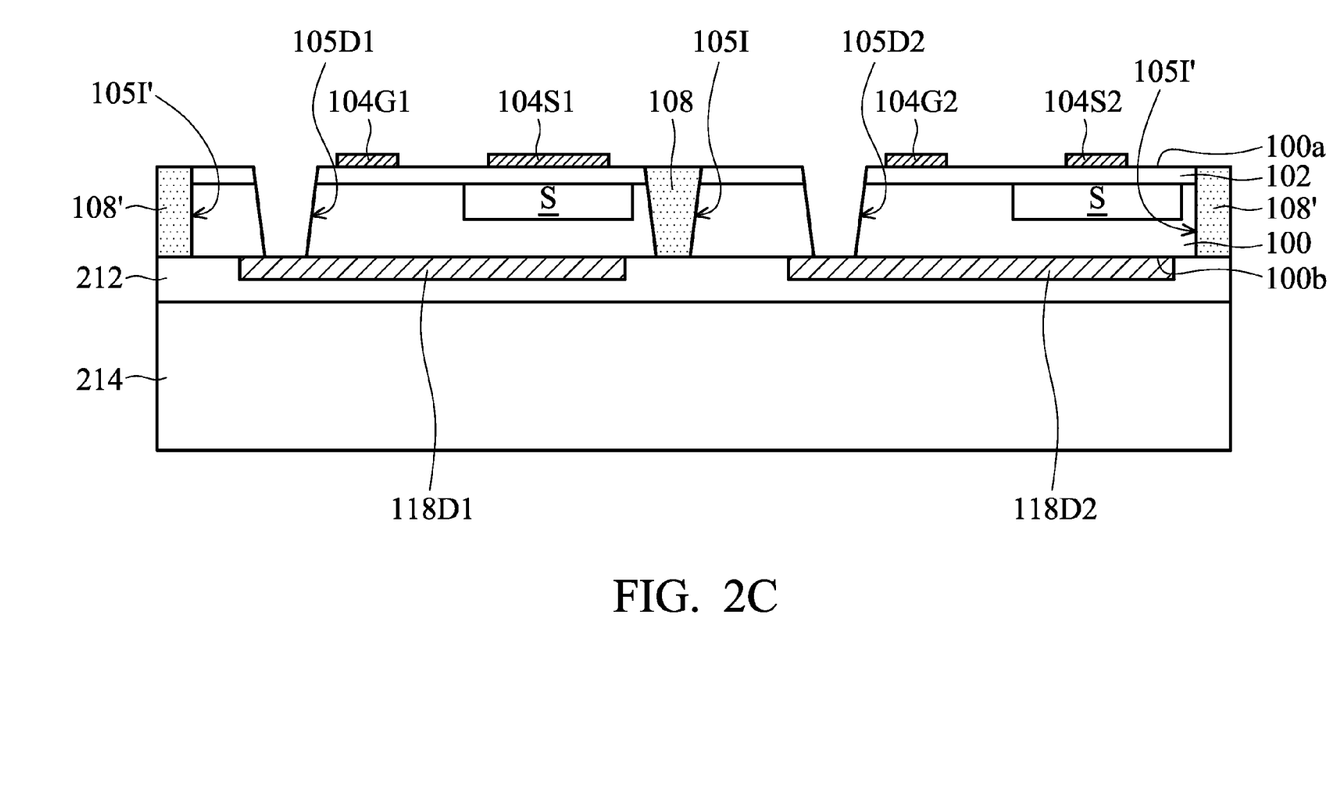

As shown in FIG. 2C, a carrier substrate 214 is disposed on the surface 100b of the semiconductor substrate 100 through an adhesion layer 212, and the adhesion layer 112 and the carrier substrate 114 previously disposed on the surface 100a of the semiconductor substrate 100 are removed. Then, a portion of the semiconductor substrate 100 is removed from the surface 100a of the semiconductor substrate 100 by using, for example, an etching process or physical drilling process, to form holes 105D1, 105D2, 105I, and 105I' extending towards the surface 100b. The holes 105I and 105I' may be filled with an insulating material to form insulating structures 108I and 108I'. The insulating structure is used to separate adjacent MOSFETs in the semiconductor substrate and divide the semiconductor substrate into two adjacent semiconductor substrates.

Figure 2D:
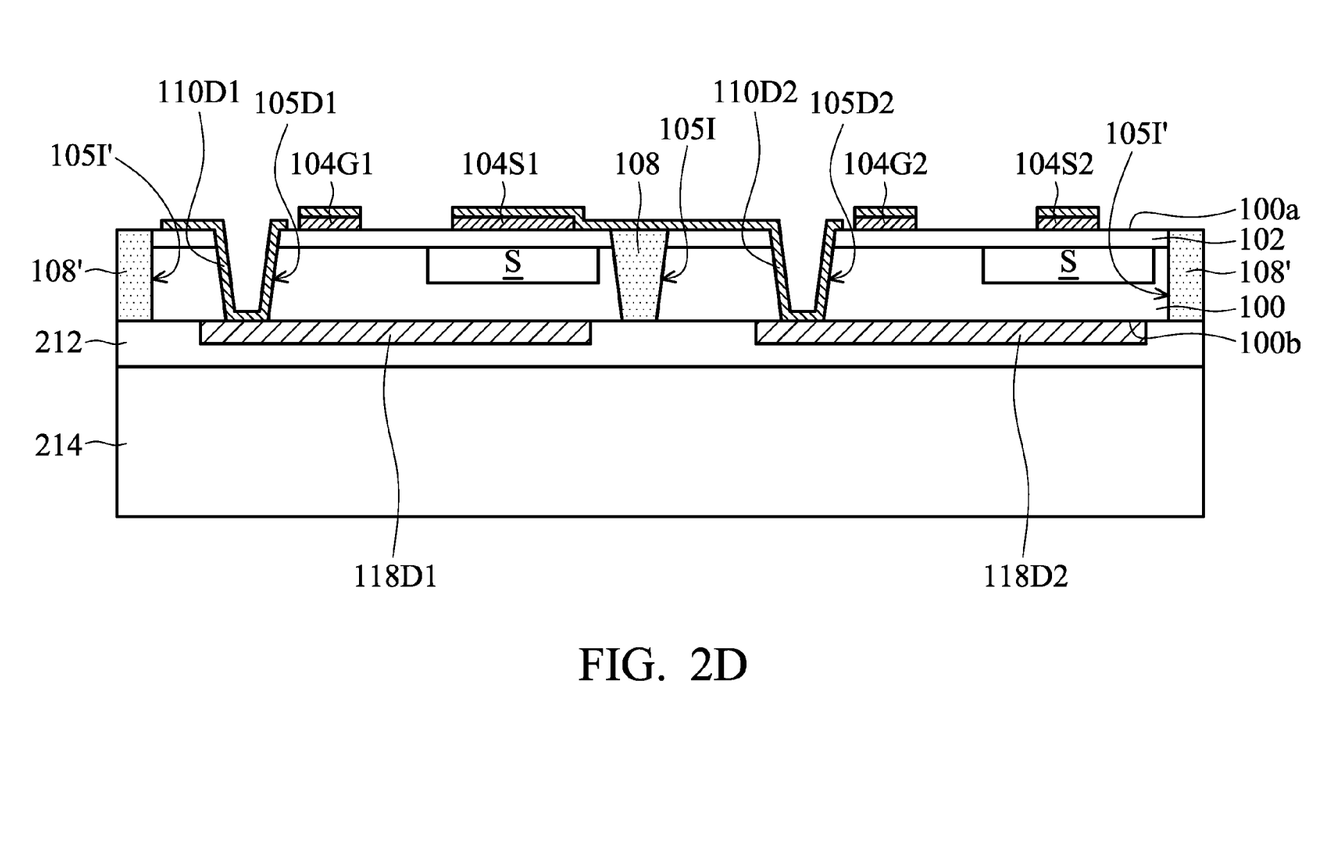

Next, as shown in FIG. 2D, patterned conducting layers 110D1 and 110D2 are formed on the surface 100a of the semiconductor substrate 100. The conducting layers 110D1 and 110D2 may extend into the holes 105D1 and 105D2, respectively. In one embodiment, the conducting layers 110D1 and 110D2 directly contact with sidewalls of the holes 105D1 and 105D2, respectively. In one embodiment, the conducting layers 110D1 and 110D2 electrically contact with the conducting layers 118D1 and 118D2, respectively. In addition, in one embodiment, when the patterned conducting layers 110D1 and 110D2 are formed, conducting layers (or redistribution layers) may be simultaneously formed on the gates and/or the source electrodes, which may serve as pads for conducting bumps to be formed in a subsequent process. As shown in FIG. 2D, in one embodiment, the drain region on the right side of the insulating structure 108 is electrically connected to the source region S on the left side of the insulating structure 108 through the through substrate conducting structure (i.e., the conducting layer 110D2), the redistribution layer on the surface 100a of the semiconductor substrate 100, and the source electrode 104S1.

Figure 2E:
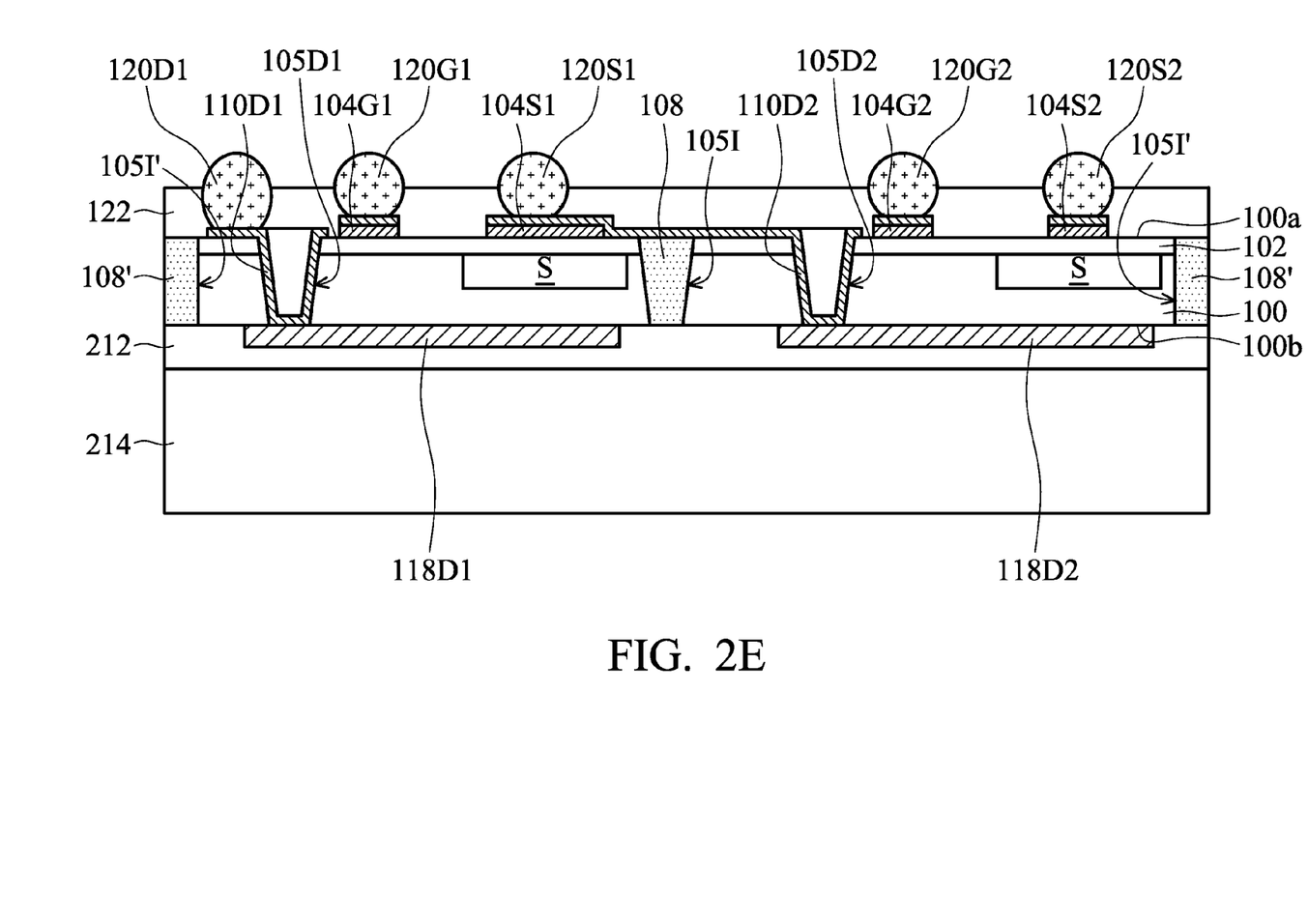

As shown in FIG. 2E, a protection layer 122 may be formed on the surface 100a of the semiconductor substrate 100. A plurality of openings may be defined in the protection layer 122, which expose the conducting layers 110D1, 110D2, the gates 104G1, 104G2 (or conducting layers on the gates), and the source electrodes 104S1, 104S2 (or conducting layers on the source electrodes). Then, conducting bumps 120D1, 120G1, 120S1, 120G2, and 120S2 may be formed in the openings of the protection layer 122, respectively. Terminal points of the conducting bumps 120D1, 120G1, 120S1, 120G2, 120S2 are substantially coplanar, thus facilitating integration with another electronic element (such as a printed circuit board). The semiconductor substrate 100 may be diced along predetermined scribe lines (not shown) in the semiconductor substrate 100 to form a plurality of individual chip packages. In addition, in one embodiment, the adhesion layer 212 and the carrier substrate 214 may be optionally removed.

In the embodiments mentioned above, the chip package includes two laterally disposed semiconductor substrates. Each of the semiconductor substrates includes a MOSFET having a gate, a source region, and a drain region. The source region of one of the MOSFETs may be electrically connected to the drain region of the other MOSFET through a through substrate conducting structure and a redistribution layer such that adjacent MOSFETs in the chip package can operate together. Through the through substrate conducting structures, electrical contacts of each of the conducting regions in the semiconductor substrate may be led to a same plane, facilitating integration with another electronic element. In the chip package of the embodiments of the invention, through a through substrate insulating structure, two adjacent semiconductor substrates may be separated from each other, preventing operations of two laterally disposed MOSFETs to interfere with each other. In addition, although the two laterally disposed semiconductor substrates are patterned from a same semiconductor substrate, embodiments of the invention are not limited thereto. In another embodiment, two pre-prepared semiconductor substrates may be disposed on a carrier substrate, and then subsequent process steps are then performed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a first semiconductor substrate;
   a drain region and a source region located in the first semiconductor substrate;
   a gate located on the first semiconductor substrate or at least partially buried in the first semiconductor substrate;
   a drain conducting structure, a source conducting structure, and a gate conducting structure, disposed on the first semiconductor substrate and electrically connected to the drain region, the source region, and the gate, respectively;
   a second semiconductor substrate laterally disposed beside the first semiconductor substrate;

a second drain region and a second source region located in the second semiconductor substrate, wherein the second drain region is electrically connected to the source region in the first semiconductor substrate;

a second gate located on the second semiconductor substrate or at least partially buried in the second semiconductor substrate;

a second source conducting structure and a second gate conducting structure disposed on the second semiconductor substrate and electrically connected to the second source region and the second gate, respectively, wherein terminal points of the drain conducting structure, the source conducting structure, the gate conducting structure, the second source conducting structure, and the second gate conducting structure are substantially coplanar; and a redistribution layer located on the second semiconductor substrate and extending onto the first semiconductor substrate to electrically connect the second drain region to the source region, wherein a portion of the redistribution layer is sandwiched between the source conducting structure and the source region.

2. The chip package as claimed in claim 1, further comprising an insulating structure located between the first semiconductor substrate and the second semiconductor substrate.

3. The chip package as claimed in claim 1, further comprising:

a first through substrate conducting structure penetrating through the first semiconductor substrate and electrically connected to the gate and the gate conducting structure;

a second through substrate conducting structure penetrating through the first semiconductor substrate and electrically connected to the source region and the source conducting structure;

a third through substrate conducting structure penetrating through the second semiconductor substrate and electrically connected to the second gate and the second gate conducting structure; and a fourth through substrate conducting structure penetrating through the second semiconductor substrate and electrically connected to the second source region and the second source conducting structure.

4. The chip package as claimed in claim 3, further comprising a plurality of insulating layers located between the first through substrate conducting structure and the first semiconductor substrate, located between the second through substrate conducting structure and the first semiconductor substrate, located between the third through substrate conducting structure and the second semiconductor substrate, and located between the fourth through substrate conducting structure and the second semiconductor substrate, respectively.

5. The chip package as claimed in claim 1, further comprising:

a fifth through substrate conducting structure penetrating through the second semiconductor substrate and electrically connected to the second drain region, wherein the redistribution layer is electrically connected to the fifth through substrate conducting structure and the source region.

6. The chip package as claimed in claim 1, further comprising:

a first through substrate conducting structure penetrating through the first semiconductor substrate and electrically connected to the drain region and the drain conducting structure; and a second through substrate conducting structure penetrating through the second semiconductor substrate and electrically connected to the second drain region and the source region.

7. The chip package as claimed in claim 6, wherein the redistribution layer is electrically connected to the second through substrate conducting structure and the source region.

8. The chip package as claimed in claim 1, wherein a thickness of the first semiconductor substrate is substantially equal to a thickness of the second semiconductor substrate.

9. The chip package as claimed in claim 1, wherein all of the drain conducting structure, the source conducting structure, the gate conducting structure, the second source conducting structure, and the second gate conducting structure comprise a solder ball.

10. The chip package as claimed in claim 1, further comprising a carrier substrate disposed on the first semiconductor substrate and the second semiconductor substrate, wherein the carrier substrate and the terminal points are located on opposite surfaces of the first semiconductor substrate, respectively.

11. A method for forming a chip package, comprising:

providing a semiconductor substrate having a first MOSFET and an adjacent second MOSFET, wherein the first MOSFET comprises a drain region, a source region, and a gate, and the second MOSFET comprises a second drain region, a second source region, and a second gate;

forming a redistribution layer extending from the second MOSFET to the first MOSFET to electrically connect the second drain region to the source region; and disposing, on a surface of the first semiconductor substrate, a drain conducting structure, a source conducting structure, and a gate conducting structure to electrically connect to the drain region, the source region, and the gate, respectively, wherein terminal points of the drain conducting structure, the source conducting structure, the gate conducting structure, the second source conducting structure, and the second gate conducting structure are substantially coplanar, wherein a portion of the redistribution layer is sandwiched between the source conducting structure and the source region.

12. The method for forming a chip package as claimed in claim 11, further comprising forming an insulating structure between the first MOSFET and the second MOSFET.

13. The method for forming a chip package as claimed in claim 11, further comprising:

forming, in the first semiconductor substrate, a first through substrate conducting structure penetrating through the first semiconductor substrate and electrically connected to the gate and the gate conducting structure;

forming, in the first semiconductor substrate, a second through substrate conducting structure penetrating through the first semiconductor substrate and electrically connected to the source region and the source conducting structure;

forming, in the first semiconductor substrate, a third through substrate conducting structure penetrating through the first semiconductor substrate and electrically connected to the second gate and the second gate conducting structure; and forming, in the first semiconductor substrate, a fourth through substrate conducting structure penetrating through the first semiconductor substrate and electrically connected to the second source region and the second source conducting structure.

14. The method for forming a chip package as claimed in claim 13, further comprising:
- removing a portion of the first semiconductor substrate to form a plurality of holes in the first semiconductor substrate; and
- forming a patterned conducting layer on the first semiconductor substrate, wherein the patterned conducting layer extends into the holes to form the first, the second, the third, and the fourth conducting structures, respectively.

15. The method for forming a chip package as claimed in claim 14, further comprising forming an insulating layer on sidewalls of the holes before the patterned conducting layer is formed.

16. The method for forming a chip package as claimed in claim 13, further comprising forming, in the first semiconductor substrate, a fifth through substrate conducting structure penetrating through the first semiconductor substrate and electrically connected to the second drain region and the source region.

17. The method for forming a chip package as claimed in claim 11, further comprising:
- forming, in the first semiconductor substrate, a first through substrate conducting structure penetrating through the first semiconductor substrate and electrically connected to the drain region and the drain conducting structure; and
- forming, in the first semiconductor substrate, a second through substrate conducting structure penetrating through the first semiconductor substrate and electrically connected to the second drain region and the source region.

18. The method for forming a chip package as claimed in claim 17, wherein both the first through substrate conducting structure and the second through substrate conducting structure directly contact with the first semiconductor substrate.

19. The method for forming a chip package as claimed in claim 11, further comprising disposing a carrier substrate on the first semiconductor substrate, wherein the carrier substrate and the terminal points are located on opposite surfaces of the first semiconductor substrate, respectively.

20. A method for forming a chip package, comprising:
- providing a first semiconductor substrate having a drain region, a source region, and a gate;
- providing a second semiconductor substrate having a second drain region, a second source region, and a second gate;
- laterally disposing the second semiconductor substrate beside the first semiconductor substrate;
- forming a redistribution layer extending from the second semiconductor substrate to the first semiconductor substrate to electrically connect the second drain region to the source region;
- disposing, on a surface of the first semiconductor substrate, a drain conducting structure, a source conducting structure, and a gate conducting structure to electrically connect to the drain region, the source region, and the gate, respectively, wherein a portion of the redistribution layer is sandwiched between the source conducting structure and the source region; and
- disposing, on a surface of the second semiconductor substrate, a second source conducting structure and a second gate conducting structure to electrically connect to the second source region and the second gate, respectively, wherein terminal points of the drain conducting structure, the source conducting structure, the gate conducting structure, the second source conducting structure, and the second gate conducting structure are substantially coplanar.

* * * * *